(12) United States Patent
Kumano et al.

(10) Patent No.: US 11,488,034 B2
(45) Date of Patent: Nov. 1, 2022

(54) STATE ANALYSIS APPARATUS, STATE ANALYSIS METHOD, AND PROGRAM

(71) Applicant: Mitsubishi Hitachi Power Systems, Ltd., Kanagawa (JP)

(72) Inventors: Shintaro Kumano, Tokyo (JP); Yasushi Morishita, Yokohama (JP); Takashi Sonoda, Tokyo (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 563 days.

(21) Appl. No.: 16/614,918

(22) PCT Filed: May 18, 2018

(86) PCT No.: PCT/JP2018/019323
§ 371 (c)(1),
(2) Date: Nov. 19, 2019

(87) PCT Pub. No.: WO2018/216620
PCT Pub. Date: Nov. 29, 2018

(65) Prior Publication Data
US 2020/0193307 A1   Jun. 18, 2020

(30) Foreign Application Priority Data

May 22, 2017 (JP) .............................. JP2017-101117

(51) Int. Cl.
*G06N 5/04* (2006.01)
*G01R 31/34* (2020.01)
(52) U.S. Cl.
CPC ............. *G06N 5/04* (2013.01); *G01R 31/343* (2013.01)

(58) Field of Classification Search
CPC ........ G06N 5/04; G01R 31/343; G01R 31/34; F04B 17/03; F04B 35/04; F04B 51/00; G05B 23/02
See application file for complete search history.

(56) References Cited

U.S. PATENT DOCUMENTS

2003/0063073 A1* 4/2003 Geaghan ............... G06F 3/0488
345/173
2006/0020177 A1* 1/2006 Seo ..................... A63B 24/0062
600/595

(Continued)

FOREIGN PATENT DOCUMENTS

EP   1 298 511   4/2003
JP   07-129232   5/1995

(Continued)

OTHER PUBLICATIONS

International Search Report dated Aug. 21, 2018 in International (PCT) Application No. PCT/JP2018/019323, with English translation.

(Continued)

*Primary Examiner* — Dinh Nguyen
(74) *Attorney, Agent, or Firm* — Wenderoth, Lind & Ponack, L.L.P.

(57) ABSTRACT

A state quantity-acquiring unit acquires values of a plurality of state quantities at a certain timing associated with an object device. A state quantity-predicting unit predicts allowable ranges of the values of the plurality of state quantities after a predetermined time has elapsed on the basis of the acquired values of the plurality of state quantities. A display information-generating unit generates display information in which a predicted-value figure which is a figure with a shape corresponding to the allowable ranges of the values of the plurality of state quantities is disposed (Continued)

in a coordinate space with the plurality of state quantities as axes.

13 Claims, 12 Drawing Sheets

(56) References Cited

U.S. PATENT DOCUMENTS

| | | | | |
|---|---|---|---|---|
| 2006/0186890 A1* | 8/2006 | Iwane | ................... | G01R 31/392 |
| | | | | 324/426 |
| 2006/0259271 A1 | 11/2006 | House et al. | | |
| 2007/0067678 A1 | 3/2007 | Hosek et al. | | |
| 2007/0208520 A1* | 9/2007 | Zhang | ................... | H02H 3/335 |
| | | | | 702/108 |
| 2007/0247767 A1* | 10/2007 | Zhang | ................... | H02H 3/006 |
| | | | | 361/42 |
| 2007/0252603 A1* | 11/2007 | Restrepo | .............. | H02H 1/0015 |
| | | | | 324/536 |
| 2008/0024140 A1* | 1/2008 | Henson | ................ | H02H 1/0015 |
| | | | | 324/536 |
| 2008/0052435 A1* | 2/2008 | Norwood | ............. | H05K 7/1467 |
| | | | | 710/301 |
| 2011/0098955 A1* | 4/2011 | Liang | ................... | G01R 35/002 |
| | | | | 702/68 |
| 2012/0041575 A1 | 2/2012 | Maeda et al. | | |
| 2013/0063056 A1 | 3/2013 | Takahashi | | |
| 2016/0140009 A1 | 5/2016 | Watanabe et al. | | |
| 2016/0202693 A1 | 7/2016 | Noda et al. | | |

FOREIGN PATENT DOCUMENTS

| | | |
|---|---|---|
| JP | 08-44421 | 2/1996 |
| JP | 3392526 | 3/2003 |
| JP | 2005-274440 | 10/2005 |
| JP | 2007-257444 | 10/2007 |
| JP | 2008-225564 | 9/2008 |
| JP | 2010-191556 | 9/2010 |
| JP | 2012-221157 | 11/2012 |
| JP | 2012-226731 | 11/2012 |
| JP | 2013-55777 | 3/2013 |
| JP | 2013-62950 | 4/2013 |
| JP | 5363238 | 12/2013 |
| JP | 2014-208245 | 11/2014 |
| JP | 5827426 | 12/2015 |
| JP | 2016-045793 | 4/2016 |
| JP | 2016-95751 | 5/2016 |
| JP | 6078951 | 2/2017 |

OTHER PUBLICATIONS

Written Opinion of the International Searching Authority dated Aug. 21, 2018 in International (PCT) Application No. PCT/JP2018/019323, with English translation.

* cited by examiner

FIG. 3

| MEASURING TIMING | KI | Lpole | Lshaft | Irms | THD | IHD | Lx | Iub |
|---|---|---|---|---|---|---|---|---|
| MM/DD hh:mm:ss | ⋮ | ⋮ | ⋮ | ⋮ | ⋮ | ⋮ | ⋮ | ⋮ |
| MM/DD hh:mm:ss | ⋮ | ⋮ | ⋮ | ⋮ | ⋮ | ⋮ | ⋮ | ⋮ |

FIG. 4

| CURRENT PARAMETER | NORMAL STATE | CAUTION STATE | ABNORMAL STATE |
|---|---|---|---|
| KI | $KI<1.0$ | $1.0 \leq KI<1.5$ | $1.5 \leq KI$ |
| Lpole | $Lpole>50dB$ | $50dB \geq Lpole>40dB$ | $40dB \geq Lpole$ |
| Lshaft | $Lshaft>50dB$ | $50dB \geq Lshaft>40dB$ | $40dB \geq Lshaft$ |
| Irms | $Irms < FLUCTUATION \pm 10\%$ | $FLUCTUATION \pm 10\% \leq Irms < FLUCTUATION \pm 20\%$ | $FLUCTUATION \pm 20\% \leq Irms$ |
| THD | $THD<5\%$ | $5\% \leq THD<10\%$ | $10\% \leq THD$ |
| IHD | $IHD<3\%$ | $3\% \leq IHD<5\%$ | $5\% \leq IHD$ |
| Lx | $Lx>50dB$ | $50dB \geq Lx>40dB$ | $40dB \geq Lx$ |
| Iub | $Iub<3\%$ | $3\% \leq Iub<5\%$ | $5\% \leq Iub$ |

STATE ANALYSIS APPARATUS, STATE ANALYSIS METHOD, AND PROGRAM

TECHNICAL FIELD

The invention relates to a state analysis device, a state analysis method, and a program.

Priority is claimed on Japanese Patent Application No. 2017-101117, filed May 22, 2017, the content of which is incorporated herein by reference.

BACKGROUND ART

Patent Literatures 1 to 4 disclose techniques of acquiring a state quantity of a device at a certain timing, predicting a state quantity in the future on the basis of the state quantity, and graphically displaying the state quantities.

CITATION LIST

Patent Literature

[Patent Literature 1]
Japanese Unexamined Patent Application, First Publication No. 2007-257444
[Patent Literature 2]
Japanese Patent No. 5827426
[Patent Literature 3]
Japanese Patent No. 3392526
[Patent Literature 4]
Japanese Patent No. 5363238

SUMMARY OF INVENTION

Technical Problem

On the other hand, a state quantity of a device does not necessarily change according to predicted values. According to the techniques described in Patent Literatures 1 to 4, a manager of a device can take countermeasures on the basis of the predicted values of the state quantity. However, there is a likelihood that the manager will not be able to appropriately cope with a case in which the state quantity changes differently from the displayed predicted values.

An object of the invention is to provide a state analysis device, a state analysis method, and a program that can effectively display predicted values of a state quantity in the future including ambiguity of prediction.

Solution to Problem

According to a first aspect of the invention, a state analysis device is provided, including: a state quantity-acquiring unit configured to acquire values of a plurality of state quantities at a certain timing associated with an object device; a state quantity-predicting unit configured to predict allowable ranges of the values of the plurality of state quantities after a predetermined time has elapsed on the basis of the acquired values of the plurality of state quantities; and a display information-generating unit configured to generate display information in which a predicted-value figure which is a figure with a shape corresponding to the allowable ranges of the values of the plurality of state quantities is disposed in a coordinate space with the plurality of state quantities as axes.

According to a second aspect of the invention, the display information-generating unit in the state analysis device according to the first aspect may be configured to generate the display information in which an acquired-value figure which is a figure representing the values of the plurality of state quantities acquired by the state quantity-acquiring unit is additionally disposed in the coordinate space.

According to a third aspect of the invention, the state analysis device according to the first or second aspect may further include a correlation-specifying unit configured to specify a correlation strength between the plurality of state quantities, and the display information-generating unit may be configured to generate the display information in which a predicted-value figure with a shape corresponding to the correlation strength is disposed.

According to a fourth aspect of the invention, the state analysis device according to any one of the first to third aspects may further include a state quantity storage unit configured to store histories of the values of the plurality of state quantities of the same type of device as the object device, and the state quantity-predicting unit may be configured to specify a plurality of parts which are similar to change of the acquired values of the plurality of state quantities out of the histories stored in the state quantity storage unit and to predict the allowable range on the basis of the plurality of parts.

According to a fifth aspect of the invention, the state quantity-predicting unit in the state analysis device according to the fourth aspect may be configured to specify a plurality of timings at which there are values similar to the acquired values of the plurality of state quantities out of the histories stored in the state quantity storage unit and to predict the allowable range on the basis of the values of the plurality of state quantities stored in the state quantity storage unit after the predetermined time elapses from the plurality of timings.

According to a sixth aspect of the invention, the state quantity-predicting unit in the state analysis device according to the fourth aspect may be configured to specify a plurality of timings at which there are changes similar to changes of the acquired values of the plurality of state quantities out of the histories stored in the state quantity storage unit and to predict the allowable range on the basis of the changes of the plurality of state quantities stored in the state quantity storage unit after the predetermined time elapses from the plurality of timings.

According to a seventh aspect of the invention, the state analysis device according to any one of the first to sixth aspects may further include a simulator that simulates an operation of the object device, and the state quantity-predicting unit may be configured to predict the allowable range on the basis of the values of the plurality of state quantities which are acquired by changing an external parameter of the simulator.

According to an eighth aspect of the invention, the display information-generating unit in the state analysis device according to any one of the first to seventh aspects may be configured to generate the display information in which the predicted-value figure with a shape including values in which an occurrence probability is equal to or greater than a predetermined value in the allowable range is disposed.

According to a ninth aspect of the invention, the state quantity-predicting unit in the state analysis device according to any one of the first to eighth aspects may be configured to predict the allowable range for each of a plurality of prediction means.

According to a tenth aspect of the invention, the state quantity-predicting unit in the state analysis device according to the ninth aspect may be configured to determine a prediction means which is used to predict the allowable range out of the plurality of prediction means on the basis of the acquired values of the plurality of state quantities and to predict the allowable range on the basis of the determined prediction means.

According to an eleventh aspect of the invention, the display information-generating unit in the state analysis device according to the ninth or tenth aspect may be configured to generate the predicted-value figure for each of the plurality of prediction means and to generate the display information in which the predicted-value figures are disposed.

According to a twelfth aspect of the invention, a state analysis method is provided, including: a step of acquiring values of a plurality of state quantities at a certain timing associated with an object device; a step of predicting allowable ranges of the values of the plurality of state quantities after a predetermined time has elapsed on the basis of the acquired values of the plurality of state quantities; and a step of generating display information in which a predicted-value figure which is a figure with a shape corresponding to the allowable ranges of the values of the plurality of state quantities is disposed in a coordinate space with the plurality of state quantities as axes.

According to a thirteenth aspect of the invention, a program is provided causing a computer to perform: a step of acquiring values of a plurality of state quantities at a certain timing associated with an object device; a step of predicting allowable ranges of the values of the plurality of state quantities after a predetermined time has elapsed on the basis of the acquired values of the plurality of state quantities; and a step of generating display information in which a predicted-value figure which is a figure with a shape corresponding to the allowable ranges of the values of the plurality of state quantities is disposed in a coordinate space with the plurality of state quantities as axes.

Advantageous Effects of Invention

According to at least one of the above-mentioned aspects, the state analysis device generates display information in which a predicted-value figure which is a figure with a shape corresponding to an allowable range of values of a plurality of state quantities is disposed. Accordingly, a manager of an object device can intuitively recognize the predicted values and ambiguity of prediction by visually recognizing the predicted-value figure.

BRIEF DESCRIPTION OF DRAWINGS

FIG. 3 is a diagram illustrating an example of information which is stored in a parameter storage unit according to the first embodiment.

FIG. 4 is a diagram illustrating an example of information which is stored in a threshold value storage unit according to the first embodiment.

DESCRIPTION OF EMBODIMENTS

First Embodiment

Hereinafter, a first embodiment will be described in detail with reference to the accompanying drawings.

<<Configuration of State Analysis System>>

Figure 1:
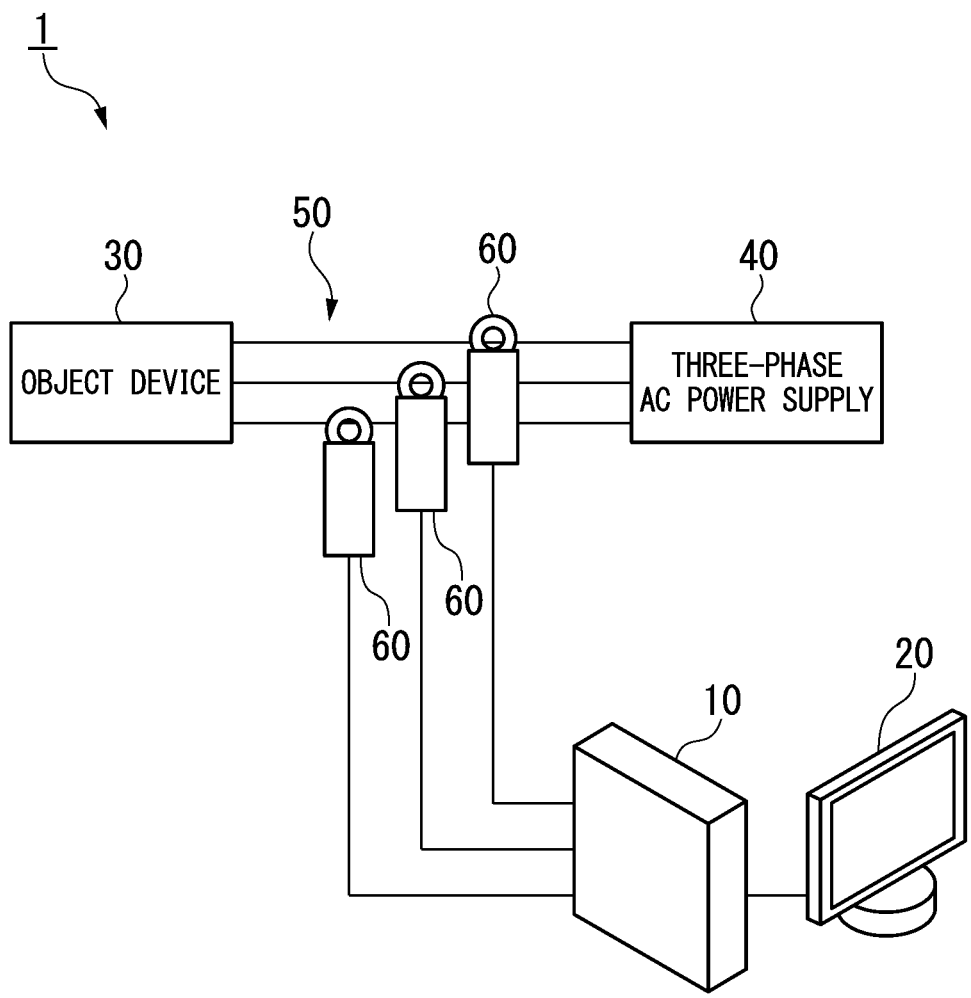
FIG. 1 is a diagram schematically illustrating a configuration of a state analysis system according to a first embodiment.

FIG. 1 is a diagram schematically illustrating a configuration of a state analysis system according to the first embodiment.

The state analysis system 1 according to the first embodiment includes a state analysis device 10, a display device 20, an object device 30, a three-phase AC power supply 40, a power line 50, and a clamp-type ammeter 60.

The state analysis device 10 according to the first embodiment causes the display device 20 to display information representing a state of the object device 30 which is to be inspected. The object device 30 according to the first embodiment is a rotary machine system including a motor that is driven by the three-phase AC power supply 40 and an auxiliary machine such as a pump or a fan that rotates along with a rotor provided in the motor. The object device 30 is connected to the three-phase AC power supply 40 via the power line 50. The power line 50 is fitted into the clamp-type ammeter 60. The state analysis system 1 includes three clamp-type ammeters 60, and the clamp-type ammeters 60 have different power lines inserted thereinto. In another embodiment, the state analysis system 1 may include one or two clamp-type ammeters 60 and may not measure a current of some of the three power lines 50. The clamp-type ammeter 60 measures a magnitude of a current flowing in the power line 50 and outputs the measured magnitude of the current as a digital signal (a current signal) to the state analysis device 10. The state analysis device 10 causes the display device 20 to display information indicating the state of the object device 30 on the basis of the current signal which is received from the clamp-type ammeter 60.

<<Configuration of State Analysis Device>>

Figure 2:
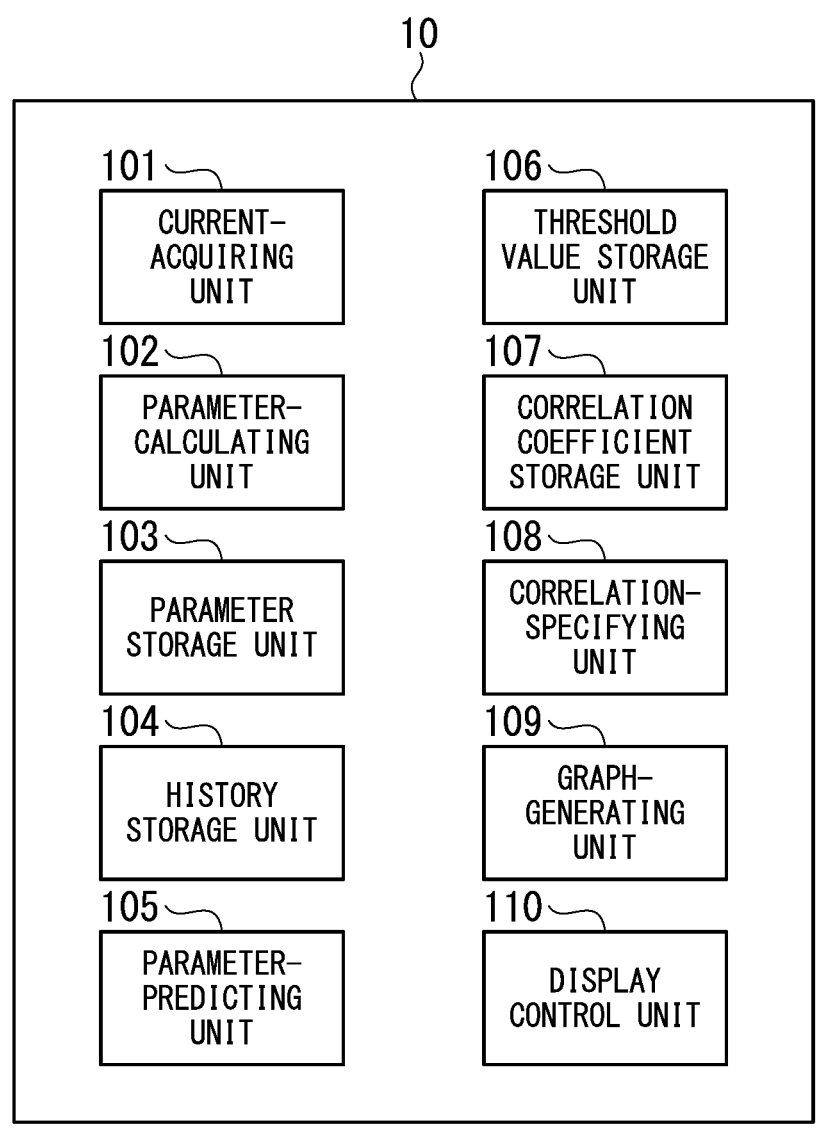
FIG. 2 is a block diagram schematically illustrating a configuration of a state analysis device according to the first embodiment.

FIG. 2 is a block diagram schematically illustrating the configuration of the state analysis device according to the first embodiment.

The state analysis device 10 includes a current-acquiring unit 101, a parameter-calculating unit 102, a parameter storage unit 103, a history storage unit 104, a parameter-predicting unit 105, a threshold value storage unit 106, a correlation coefficient storage unit 107, a correlation-specifying unit 108, a graph-generating unit 109, and a display control unit 110.

The current-acquiring unit 101 acquires a signal of a current flowing in the object device 30 from the clamp-type ammeter 60 via the power line 50.

The parameter-calculating unit 102 calculates values of a plurality of parameters that change depending on the state of the object device 30 on the basis of the current signal acquired by the current-acquiring unit 101 at a timing associated with a predetermined cycle. In the following description, parameters which are calculated by the parameter-calculating unit 102 are referred to as current parameters. Specific examples of the current parameters will be described later. At least two of the plurality of current parameters which are calculated by the parameter-calculating unit 102 have a correlation with each other. The values of the current parameters are an example of values of a plurality of state quantities associated with the object device 30.

The parameter storage unit 103 stores the values of the plurality of current parameters calculated by the parameter-calculating unit 102 in correlation with the calculation timings thereof.

The history storage unit 104 stores histories of the values of the plurality of current parameters of other devices of the same type (such as devices of the same form) as the object device 30.

The parameter-predicting unit 105 predicts an allowable range of values of a plurality of current parameters at a timing after a predetermined time has elapsed on the basis of a time series of the values of the plurality of current parameters stored in the history storage unit 104 and the values of the plurality of current parameters calculated by the parameter-calculating unit 102.

Specifically, the parameter-predicting unit 105 predicts the allowable range of the values of the plurality of current parameters in the following order. The parameter-predicting unit 105 specifies a plurality of timings at which the values of the current parameters are close to the values of the current parameters at a certain timing calculated by the parameter-calculating unit 102 (for example, timings at which a mean square error of the values of the current parameters becomes equal to or less than a predetermined threshold value) in a time series of the values of the plurality of current parameters stored in the history storage unit 104. Then, the parameter-predicting unit 105 specifies the values of the plurality of current parameters at a timing after a predetermined time has elapsed from each timing. The parameter-predicting unit 105 predicts a range from a minimum value to a maximum value of a plurality of specified values for each current parameter as an allowable range of the values of the current parameters.

The threshold value storage unit 106 stores a threshold value which is used as a basis for determination of the state of the object device 30 for each current parameter. The types of the state of the object device 30 according to the first embodiment include a normal state in which the object device 30 is normal, an abnormal state in which the object device 30 is abnormal, and a caution state in which the state of the object device 30 can change to the abnormal state.

The correlation coefficient storage unit 107 stores a correlation coefficient between two current parameters for a group of two different current parameters. The correlation coefficient between two current parameters is calculated in advance. Details of the correlation between current parameters will be described later.

The correlation-specifying unit 108 specifies a correlation coefficient correlated with a group of current parameters to be displayed from the correlation coefficient storage unit 107.

The graph-generating unit 109 generates a graphic image indicating a predicted change of a current parameter from the values of the current parameters calculated by the parameter-calculating unit 102 and the predicted values of the current parameters calculated by the parameter-predicting unit 105. The graphic image is a graph with two current parameters set as the vertical axis and the horizontal axis. In the graphic image, partition lines indicating threshold values associated with the current parameters, a plot (an acquired-value figure) indicating the values of two current parameters calculated by the parameter-calculating unit 102, a circle (a predicted-value figure) indicating the predicted values of two current parameters calculated by the parameter-predicting unit 105, and arrows indicating the changes thereof are disposed.

The display control unit 110 generates display information which is to be output to the display device 20 on the basis of the graph image generated by the graph-generating unit 109. The display control unit 110 is an example of a display information-generating unit.

<<Current Parameter>>

The current parameters which are calculated by the parameter-calculating unit 102 according to the first embodiment will be described below.

The parameter-calculating unit 102 according to the first embodiment calculates a KI parameter, an Lpole parameter, an Lshaft parameter, an Irms parameter, a THD parameter, an IHD parameter, an Lx parameter, and an Iub parameter.

The KI parameter is a parameter indicating a general state of the object device 30. The KI parameter is Kullback-Leibler divergence with respect to a check amplitude probability density function ft(x) which is acquired from the current signal and a reference amplitude probability density function fr(x) of a reference sinusoidal signal waveform indicating a rated current of the motor. Specifically, the KI parameter is calculated by Equation (1).

[Math. 1]

$$KI = \int_{-\infty}^{\infty} fr(x) \log \frac{fr(x)}{ft(x)} dx \quad (1)$$

The Lpole parameter is a parameter indicating a rotor state of the object device 30. The Lpole parameter is the magnitude of a peak of a sideband wave of a current spectrum at a frequency position which is separated from the peak of the current spectrum in the frequency spectrum by a predetermined frequency. The frequency spectrum is acquired by converting the current signal into a frequency domain. The sideband wave associated with the Lpole parameter is a sideband wave which varies due to a pole-passing frequency of the motor.

The Lshaft parameter is a parameter indicating a misalignment state of a rotor and an auxiliary machine of the object device 30. The Lshaft parameter is acquired by the magnitude of a peak of a sideband wave of a current spectrum at a frequency position which is separated by a predetermined frequency from the peak of the current spectrum in the frequency spectrum acquired by converting the current signal into the frequency domain. The sideband wave associated with the Lshaft parameter is a sideband wave which varies due to an actual rotational frequency of the motor.

The Irms parameter is a parameter which is used to monitor a rotary machine load and state change of the object device 30. The Irms parameter is an effective current value which can be acquired by dividing a square sum of the current values at each sampling timing by the number of sampling timings and calculating a square root thereof.

The IHD parameter is a ratio between a maximum harmonic component and a power-supply frequency component of a current signal. The IHD parameter can be acquired by extracting a harmonic component from a current signal and dividing a maximum value in a preset order of the harmonic component by an effective power-supply frequency value.

The THD parameter is a ratio between a total harmonic component and a power-supply frequency component of a current signal. The THD parameter can be acquired by extracting a harmonic component from a current signal and dividing a square root of a square sum of harmonic components in a preset order by an effective power-supply frequency value of the current signal. The IHD parameter and the THD parameter are both parameters indicating quality of the three-phase AC power supply 40.

The Lx parameter is a parameter indicating an auxiliary machine state of the object device 30. The Lx parameter is the magnitude of a peak of a sideband wave of a current spectrum at a frequency position which is by separated a predetermined frequency from the peak of the current spectrum in the frequency spectrum which is acquired by converting a current signal into a frequency domain. The sideband wave associated with the Lx parameter is a sideband wave which varies due to a blade-passing frequency of a pump or a blower, a sideband wave which varies due to a meshing frequency of a gear device, a sideband wave which varies due to a rotational frequency of a pulley belt, or a sideband wave which varies due to a slip frequency of a rotor bar.

The Lx parameter which is indicated by the magnitude of a peak of the sideband wave varying due to a blade-passing frequency of a pump or a blower is referred to as an Lbp parameter. The Lx parameter which is indicated by the magnitude of a peak of the sideband wave varying due to a meshing frequency of a gear device is referred to as an Lgz parameter. The Lx parameter which is indicated by the magnitude of a peak of the sideband wave varying due to a rotational frequency of a pulley belt is referred to as an Lbr parameter. The Lx parameter which is indicated by the magnitude of a peak of the sideband wave varying due to a slip frequency of a rotor bar is referred to as an Lrs parameter. The pump, the blower, the gear device, the pulley belt, and the rotor bar are examples of the auxiliary machine of the object device 30.

The Iub parameter is a parameter indicating power supply quality or a degree of deterioration of a stator of a motor and an inverter. The Iub parameter can be acquired by dividing a difference between a maximum value and a minimum value in an effective current value of a three-phase current signal by the sum of the maximum value and the minimum value. That is, the Iub parameter is a parameter indicating three-phase current balance of a current signal.

The KI parameter increases when the rotor state deteriorates, and the Lpole parameter decreases when the rotor state deteriorates. That is, the KI parameter and the Lpole parameter have a correlation with the rotor state of the object device 30. That is, the correlation coefficient storage unit 107 stores a correlation coefficient of a negative value in correlation with a group of the KI parameter and the Lpole parameter.

The KI parameter increases when an unbalanced state of a shaft system of the motor deteriorates, and the Lshaft parameter and various Lx parameters decrease when the unbalanced state of the shaft system of the motor deteriorates. That is, the KI parameter and the Lshaft parameter and various Lx parameters have a correlation with the unbalanced state of the shaft system of the motor of the object device 30. The KI parameter increases when a misalignment state of the shaft system of the motor deteriorates, and the Lshaft parameter decreases when the misalignment state of the shaft system of the motor deteriorates. That is, the KI parameter and the Lshaft parameter have a correlation with the misalignment state of the shaft system of the motor of the object device 30. That is, the correlation coefficient storage unit 107 stores a correlation coefficient of a negative value in correlation with a group of the KI parameter and the Lshaft parameter and a group of the KI parameter and various Lx parameters.

The KI parameter and the Irms parameter both increase when a load-varying state deteriorates. That is, the KI parameter and the Irms parameter have a correlation with the load-varying state of the object device 30. That is, the correlation coefficient storage unit 107 stores a correlation coefficient of a positive value in correlation with a group of the KI parameter and the Irms parameter.

The KI parameter, the THD parameter, the IHD parameter, and the Iub parameter all increase when the stator state of the motor or the power supply quality deteriorates. That is, the KI parameter, the THD parameter, the IHD parameter, and the Iub parameter have a correlation with the stator state or the power supply quality of the object device 30. That is, the correlation coefficient storage unit 107 stores a correlation coefficient of a positive value in correlation with a group of the KI parameter and the THD parameter, a group of the KI parameter and the IHD parameter, a group of the KI parameter and the Iub parameter, a group of the THD parameter and the IHD parameter, a group of the THD parameter and the Iub parameter, and a group of the IHD parameter and the Iub parameter.

The Lpole parameter and the Lshaft parameter both decrease when the state of the motor deteriorates. That is, the Lpole parameter and the Lshaft parameter have a correlation with the rotor state of the object device 30. That is, the correlation coefficient storage unit 107 stores a correlation coefficient of a positive value in correlation with a group of the Lpole parameter and the Lshaft parameter.

FIG. 3 is a diagram illustrating an example of information which is stored in the parameter storage unit according to the first embodiment.

As illustrated in FIG. 3, the parameter storage unit 103 stores a measuring timing, the KI parameter, the Lpole parameter, the Lshaft parameter, the Irms parameter, the THD parameter, the IHD parameter, the Lx parameter, and the Iub parameter in correlation with each other at each measuring timing which is a timing associated with a predetermined cycle (for example, a half day or one day).

FIG. 4 is a diagram illustrating an example of information which is stored in the threshold value storage unit according to the first embodiment.

As illustrated in FIG. 4, the threshold value storage unit 106 stores a range of values in a normal state, a range of values in a caution state, and a range of values in an abnormal state for each of the KI parameter, the Lpole parameter, the Lshaft parameter, the Irms parameter, the THD parameter, the IHD parameter, the Lx parameter, and the Iub parameter.

In the first embodiment, the range of values in the normal state, the range of values in the caution state, and the range of values in the abnormal state for each current parameter are as follows. The following ranges are only examples and other embodiments are not limited thereto.

The range of values of the KI parameter in the normal state is less than 1.0. The range of values of the KI parameter in the caution state is equal to or greater than 1.0 and less than 1.5. The range of values of the KI parameter in the abnormal state is equal to or greater than 1.5. That is, a first threshold value for the KI parameter is 1.0, and a second threshold value for the KI parameter is 1.5.

The range of values of the Lpole parameter in the normal state is greater than 50 dB. The range of values of the Lpole parameter in the caution state is greater than 40 dB and equal to or less than 50 dB. The range of values of the Lpole parameter in the abnormal state is equal to or less than 40 dB. That is, a first threshold value for the Lpole parameter is 50 dB, and a second threshold value for the Lpole parameter is 40 dB.

The range of values of the Lshaft parameter in the normal state is greater than 50 dB. The range of values of the Lshaft parameter in the caution state is greater than 40 dB and equal to or less than 50 dB. The range of values of the Lshaft parameter in the abnormal state is equal to or less than 40 dB. That is, a first threshold value for the Lshaft parameter is 50 dB, and a second threshold value for the Lshaft parameter is 40 dB.

The range of values of the Irms parameter in the normal state is less than fluctuation±10%. The range of values of the Irms parameter in the caution state is equal to or greater than fluctuation±10% and less than fluctuation±20%. The range of values of the Irms parameter in the abnormal state is equal to or greater than fluctuation±20%. That is, a first threshold value for the Irms parameter is fluctuation±10%, and a second threshold value for the Irms parameter is fluctuation±20%.

The range of values of the THD parameter in the normal state is less than 5%. The range of values of the THD parameter in the caution state is equal to or greater than 5% and less than 10%. The range of values of the THD parameter in the abnormal state is equal to or greater than 10%. That is, a first threshold value for the THD parameter is 5%, and a second threshold value for the THD parameter is 10%.

The range of values of the IHD parameter in the normal state is less than 3%. The range of values of the IHD parameter in the caution state is equal to or greater than 3% and less than 5%. The range of values of the IHD parameter in the abnormal state is equal to or greater than 5%. That is, a first threshold value for the IHD parameter is 3%, and a second threshold value for the IHD parameter is 5%.

The range of values of the Lx parameter in the normal state is greater than 50 dB. The range of values of the Lx parameter in the caution state is greater than 40 dB and equal to or less than 50 dB. The range of values of the Lx parameter in the abnormal state is equal to or less than 40 dB. That is, a first threshold value for the Lx parameter is 50 dB, and a second threshold value for the Lx parameter is 40 dB.

The range of values of the Iub parameter in the normal state is less than 3%. The range of values of the Iub parameter in the caution state is equal to or greater than 3% and less than 5%. The range of values of the Iub parameter in the abnormal state is equal to or greater than 5%. That is, a first threshold value for the Iub parameter is 3%, and a second threshold value for the Iub parameter is 5%.

<<Operation of State Analysis Device>>

The operation of the state analysis device 10 according to the first embodiment will be described below.

Figure 5:
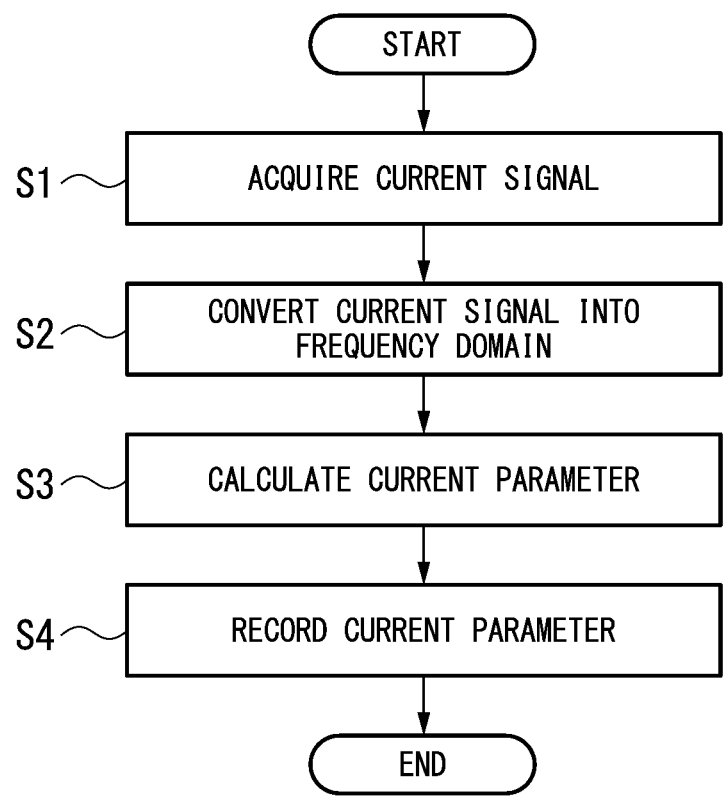
FIG. 5 is a flowchart illustrating a current parameter-calculating process routine which is performed by the state analysis device according to the first embodiment.

FIG. 5 is a flowchart illustrating a current parameter-calculating process routine which is performed by the state analysis device according to the first embodiment. The state analysis device 10 performs the current parameter-calculating process routine at intervals of a predetermined cycle. The current-acquiring unit 101 of the state analysis device 10 acquires a current signal from the clamp-type ammeter 60 (Step S1). Since the current-acquiring unit 101 acquires the current signal at each sampling timing, the current signal acquired by the current-acquiring unit 101 represents change of the magnitude of a current in a predetermined period. Then, the parameter-calculating unit 102 converts the current signal into a frequency domain and generates a frequency-domain waveform (Step S2). An example of the method for frequency domain conversion is an FFT.

The parameter-calculating unit 102 calculates values of a plurality of current parameters on the basis of the current signal acquired in Step S1 and the frequency-domain waveform generated in Step S2 (Step S3). The parameter-calculating unit 102 stores the calculated values of the plurality of current parameters in the parameter storage unit 103 in correlation with a current time (Step S4).

The state analysis device 10 can store time series of a plurality of current parameters in the parameter storage unit 103 by performing the current parameter-calculating process routine at intervals of a predetermined cycle.

Figure 6:
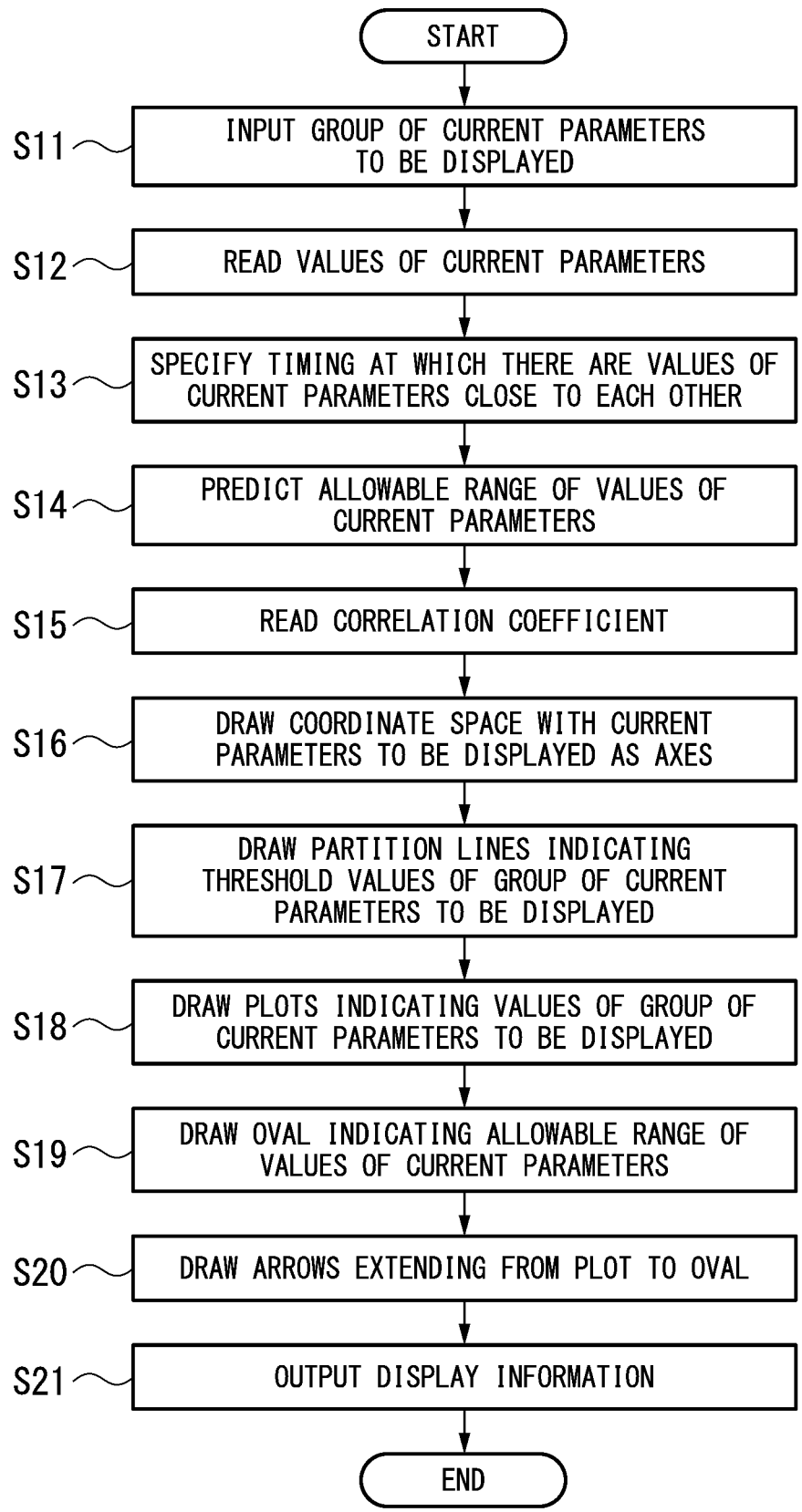
FIG. 6 is a flowchart illustrating a current parameter-displaying process routine which is performed by the state analysis device according to the first embodiment.

FIG. 6 is a flowchart illustrating a current parameter-displaying process routine which is performed by the state analysis device according to the first embodiment.

When it is instructed to display current parameters by a manager of the object device 30 who operates the object device, the state analysis device 10 receives an input of a group of current parameters which is to be displayed (Step S11). The input of a group of current parameters is performed by the manager's selection from a preset list of parameter pairs having a correlation in the state analysis device 10 (for example, a pair of the Lshaft parameter and the Lpole parameter, a pair of the THD parameter and the IHD parameter, and a pair of the KI parameter and the Lx parameter). In another embodiment, the input of the group of current parameters may be performed by causing the manager to input two arbitrary parameters.

Then, the parameter-predicting unit 105 of the state analysis device 10 reads the latest stored information as values of current parameters of the selected pair from the parameter storage unit 103 (Step S12). Then, the parameter-predicting unit 105 specifies a plurality of timings at which the values of the current parameters of the selected pair are close to the values read in Step S12 from the history storage unit 104 (Step S13). Accordingly, the parameter-predicting unit 105 specifies a plurality of timings at which the values of the current parameters of the selected pair change similarly. The parameter-predicting unit 105 predicts a range from a minimum value to a maximum value of the value of a current parameter associated with the plurality of specified timings as an allowable range of the value of the current parameter for each current parameter of the selected pair (Step S14). The correlation-specifying unit 108 reads a correlation coefficient correlated with the current parameters of the selected pair from the correlation coefficient storage unit 107 (Step S15).

Then, the graph-generating unit 109 of the state analysis device 10 draws a coordinate space with the current parameters of the selected pair as axes G1 (Step S16). That is, the graph-generating unit 109 draws axes G1 which are orthogonal and which represent the current parameters of one pair. In this embodiment, "draw" means that a figure is disposed in a virtual space (a virtual plane). Then, the graph-generating unit 109 reads a first threshold value and a second threshold value for each current parameter of the selected pair from the threshold value storage unit 106 and draws a partition line G2 indicating the first threshold value and a partition line G2 indicating the second threshold value (Step S17). The partition lines G2 indicating the threshold values for a current parameter are lines which are parallel to the axis G1 representing the current parameter. Then, the graph-generating unit 109 draws a plot G3 indicating the latest stored values of the current parameters of the selected pair from the parameter storage unit 103 in the coordinate space (Step S18).

Then, the graph-generating unit 109 draws an oval G4 (such as an elliptical shape, an oblong shape, or an oval shape) which is inscribed in a rectangle corresponding to the allowable range which is predicted in the coordinate space by the parameter-predicting unit 105 in the coordinate space on the basis of the correlation coefficient specified by the correlation-specifying unit 108 (Step S19). The shape of the oval G4 has a thinner and longer shape as the absolute value of the correlation coefficient increases, and has a more circular shape as the absolute value of the correlation coefficient decreases. That is, the area of the oval G4 increases as the allowable range predicted by the parameter-predicting unit 105 increases and as the absolute value of the correlation coefficient decreases (as the correlation becomes weaker). On the other hand, the area of the oval G4 decreases as the allowable range predicted by the parameter-predicting unit 105 decreases and as the absolute value of the correlation coefficient increases (as the correlation becomes stronger). The slope of the oval G4 is positive when the correlation coefficient has a positive value, and is negative when the correlation coefficient has a negative value.

The graph-generating unit 109 draws arrows G5 which extend from the plot G3 to the outline of the oval G4 in the coordinate space (Step S20).

Then, the display control unit 110 generates display information on the basis of the figure which is drawn by the graph-generating unit 109 and outputs the display information to the display device 20 (Step S21). Accordingly, the display device 20 displays a graph in which the partition lines G2 indicating the threshold values of the current parameters, the plot G3 indicating the values of the pair of current parameters, the oval G4 indicating the allowable range of the values of the pair of current parameters after a predetermined time has elapsed, and the arrows G5 indicating change of the values of the pair of current parameters are disposed.

<<Display Example>>

Figure 7:
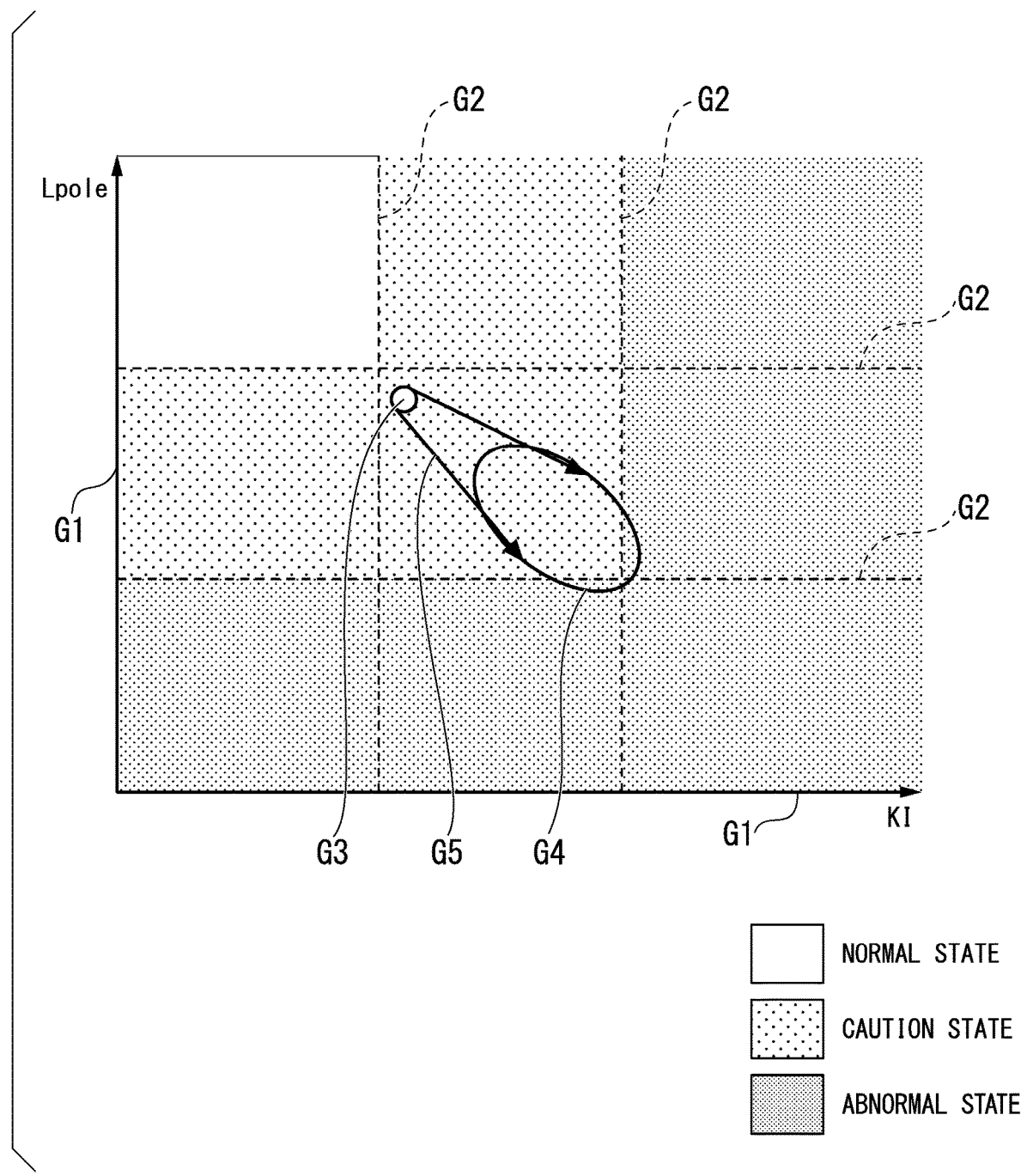
FIG. 7 is a diagram illustrating an example of a first graph representing a relationship between a KI parameter and an Lpole parameter.

FIG. 7 is a diagram illustrating an example of a first graph representing a relationship between the KI parameter and the Lpole parameter.

When a manager of the object device 30 selects a pair of the KI parameter and the Lpole parameter in Step S11, a graph illustrated in FIG. 7 is displayed on the display device 20. According to the graph illustrated in FIG. 7, a current state and a predetermined-time-elapse state of the object device 30 can be determined on the basis of the KI parameter and the Lpole parameter. According to the graph illustrated in FIG. 7, in the plot G3, the KI parameter and the Lpole parameter are both in the caution state. On the other hand, the oval G4 extends over the area of the caution state and the area of the abnormal state. Here, since the area in which the oval G4 overlaps the abnormal state is small, a manager of the object device 30 can visually determine that the object device may enter the abnormal state after a predetermined time elapses but the probability that the object device enters the abnormal state is low.

Since the KI parameter and the Lpole parameter have a negative correlation, the oval G4 is drawn to be longitudinal to the right-lower side. That is, a range of deviation of prediction is displayed to be small depending on the correlation strength. Accordingly, a manager can visually recognize accuracy of prediction based on the correlation strength.

In this way, according to the first embodiment, the state analysis device 10 generates display information in which an oval G4 representing an allowable range of the value of the current parameters of one pair after a predetermined time elapses is disposed in a coordinate space with a plurality of current parameters as axes. Accordingly, a manager can intuitively recognize predicted values and ambiguity of prediction by visually recognizing the position and the size of the oval G4. According to the first embodiment, the state analysis device 10 disposes a plot G3 indicating the values of the current parameters at the current time in the display information. Accordingly, a manager can recognize the magnitude of change of the values of the current parameters by visually recognizing the relationship between the position of the plot G3 and the position of the oval G4.

According to the first embodiment, the parameter-predicting unit 105 specifies a timing at which the value of each current parameter is close to the values stored latest in the parameter storage unit 103 from the history storage unit 104, but the invention is not limited thereto. For example, in another embodiment, the parameter-predicting unit 105 may specify a time series similar to the time series of the values of the current parameters in a predetermined time range including the timing at which the values of the current parameters are stored latest in the parameter storage unit 103 from the parameter storage unit 103. In this case, the parameter-predicting unit 105 predicts the allowable range of the value of each current parameter on the basis of the values of the current parameters associated with the latest timing of the time series.

Figure 8:
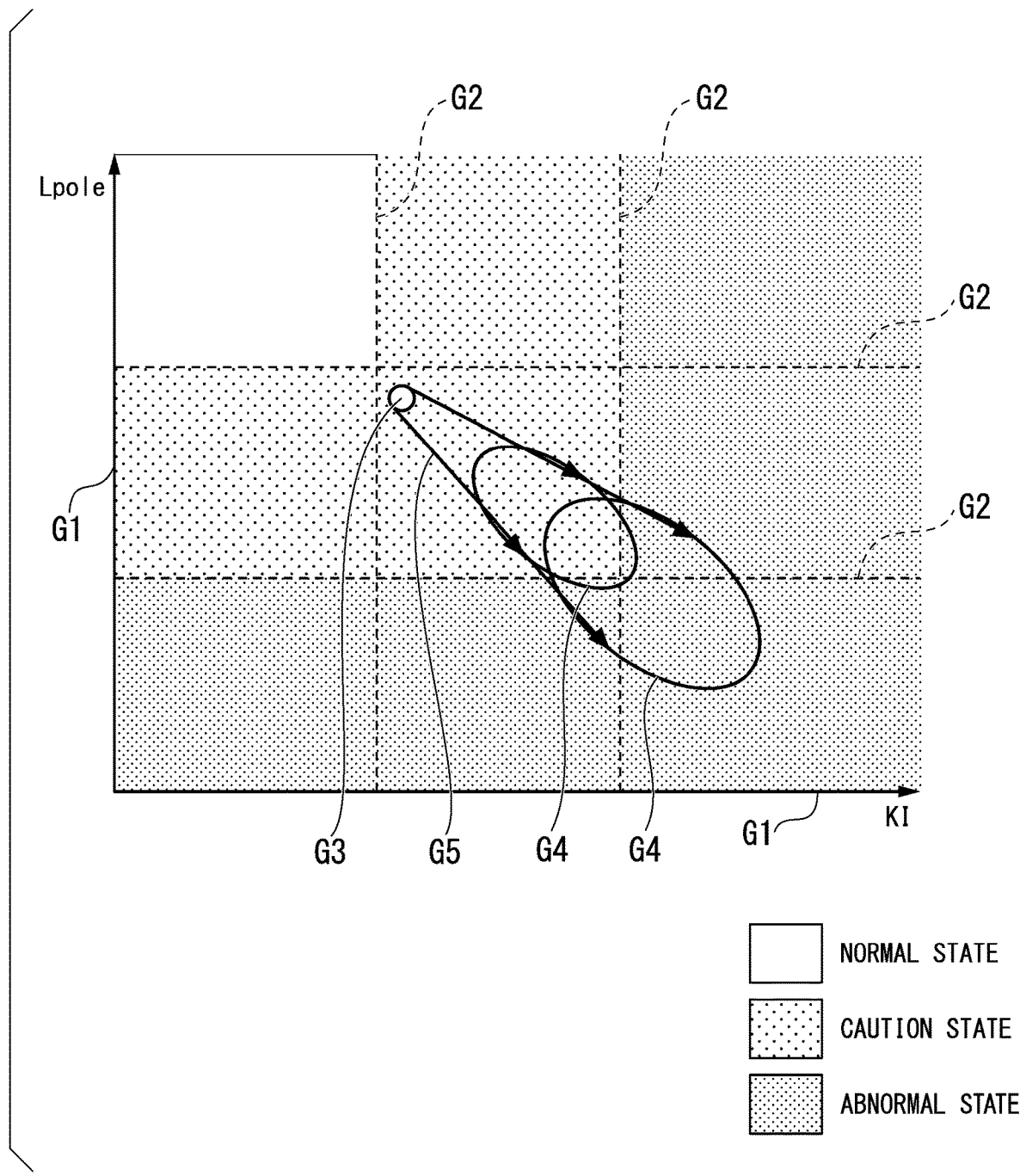
FIG. 8 is a diagram illustrating an example of the first graph representing a relationship between a KI parameter and an Lpole parameter.

FIG. 8 is a diagram illustrating an example of a second graph representing a relationship between the KI parameter and the Lpole parameter.

According to the first embodiment, the graph-generating unit 109 generates display information including an oval G4 representing an allowable range of the values of the current parameters of one pair after a predetermined time elapses, but may generate display information including a plurality of ovals G4 every time in another embodiment. For example, the parameter-predicting unit 105 estimates an allowable range of the values of the current parameters of one pair for each of timing T1 at which a time Δt has elapsed from the current time and timing T2 at which a time 2Δt has elapsed from the current time, and the graph-generating unit 109 generates an ovals G4 for the allowable ranges thereof as illustrated in FIG. 8.

Second Embodiment

The state analysis device 10 according to the first embodiment predicts an allowable range of the values of the current parameters of the object device 30 on the basis of the timings at which values of current parameters of the same type of device similar to the values of the current parameters of the object device 30 at a certain timing are taken in histories of the calculated current parameters of the object device 30 and the current parameters of the same type of device as the current. On the other hand, a state analysis device 10 according to a second embodiment predicts an allowable range of the values of the current parameters on the basis of the timings at which the values of the current parameters change similarly in histories of the current parameters of the same type of device.

Specifically, the parameter-predicting unit 105 according to the second embodiment specifies a plurality of timings at which changes of the values of the current parameters in a time series of the values of a plurality of current parameters stored in the history storage unit 104 are similar to changes of the values of the current parameters calculated by the parameter-calculating unit 102 (for example, timings at which the mean square error of the values of the current parameters is equal to or less than a predetermined threshold value). Then, the parameter-predicting unit 105 specifies changes of the values of the plurality of current parameters at a timing at which a predetermined time has elapsed from each of the specified timings. Accordingly, the parameter-predicting unit 105 specifies a plurality of timings at which the values of the current parameters of the selected pair change similarly. The parameter-predicting unit 105 predicts a range from a value obtained by adding a minimum value of the specified changes to the values of the current parameters calculated by the parameter-calculating unit 102 to a value obtained by adding a maximum value of the specified changes thereto as an allowable range of the values of the current parameters.

Third Embodiment

The state analysis device 10 according to the first and second embodiments predicts the allowable range of the values of the current parameters of the object device 30 on the basis of calculation of the current parameters of the object device 30 and operation histories of the same type of devices. On the other hand, a state analysis device 10 according to a third embodiment predicts an allowable range of the values of the current parameters on the basis of a result of simulation from a simulator.

Figure 9:
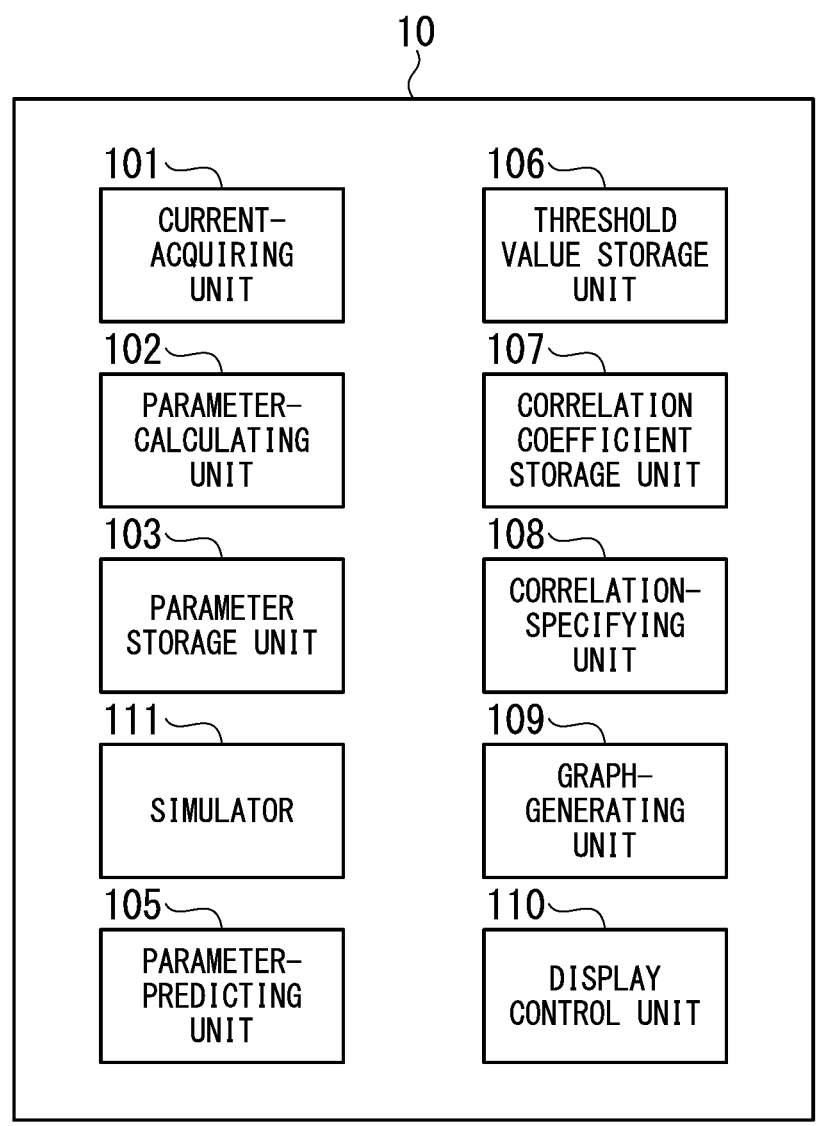
FIG. 9 is a block diagram schematically illustrating a configuration of a state analysis device according to a third embodiment.

FIG. 9 is a block diagram schematically illustrating a configuration of a state analysis device according to a third embodiment.

The state analysis device 10 according to the third embodiment includes a simulator 111 instead of the history storage unit 104 according to the first embodiment.

The simulator 111 simulates the operation of the object device 30. The parameter-predicting unit 105 predicts values of current parameters on the basis of the result of simulation from the simulator 111.

Figure 10:
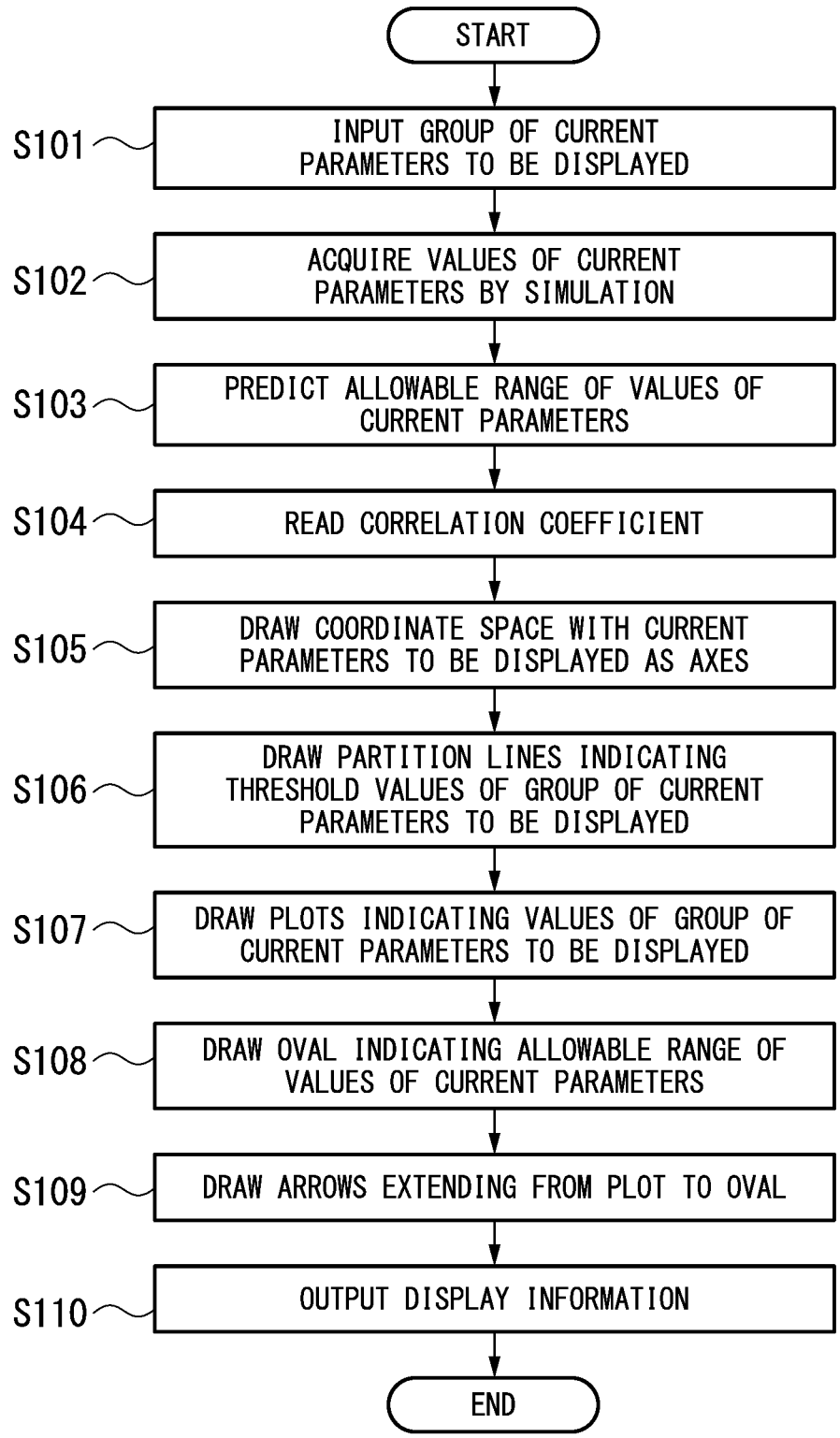
FIG. 10 is a flowchart illustrating a current parameter-displaying process routine which is performed by the state analysis device according to the third embodiment.

FIG. 10 is a flowchart illustrating a current parameter-displaying process routine which is performed by the state analysis device according to the third embodiment. The processes in the flowchart illustrated in FIG. 10 may be arbitrarily changed in order or may be performed in parallel, as long as the process details thereof are not contradictory.

When it is instructed to display current parameters by a manager of the object device 30 who operates the object device, the state analysis device 10 receives an input of a group of current parameters which is to be displayed (Step S101). Then, the simulator 111 simulates the state of the object device 30 after a predetermined time has elapsed on the basis of current state quantities of the object device 30.

At this time, the simulator 111 acquires a plurality of values of the current parameters at a timing at which the predetermined time has elapsed by performing simulation a plurality of times while changing external parameters (such as an atmospheric air temperature) used to perform the simulation (Step S102).

The parameter-predicting unit 105 predicts a range from a minimum value to a maximum value of the plurality of values calculated by the simulator 111 as an allowable range of the values of the current parameters for the current parameters of the selected pair (Step S103). The correlation-specifying unit 108 reads a correlation coefficient correlated with the current parameters of the selected pair from the correlation coefficient storage unit 107 (Step S104).

Then, the graph-generating unit 109 of the state analysis device 10 draws a coordinate space with the current parameters of the selected pair as axes G1 (Step S105). That is, the graph-generating unit 109 draws axes G1 which are orthogonal and which represent the current parameters of one pair. In this embodiment, "draw" means that a figure is disposed in a virtual space (a virtual plane). Then, the graph-generating unit 109 reads a first threshold value and a second threshold value for each current parameter of the selected pair from the threshold value storage unit 106 and draws a partition line G2 indicating the first threshold value and a partition line G2 indicating the second threshold value (Step S106). The partition lines G2 indicating the threshold values for a current parameter are lines which are parallel to the axis G1 representing the current parameter. Then, the graph-generating unit 109 draws a plot G3 indicating the latest stored values of the current parameters of the selected pair from the parameter storage unit 103 in the coordinate space (Step S107).

Then, the graph-generating unit 109 draws an oval G4 which is inscribed in a rectangle corresponding to the allowable range which is predicted in the coordinate space by the parameter-predicting unit 105 in the coordinate space on the basis of the correlation coefficient specified by the correlation-specifying unit 108 (Step S108). The graph-generating unit 109 draws arrows G5 which extend from the plot G3 to the outline of the oval G4 in the coordinate space (Step S109).

Then, the display control unit 110 generates display information on the basis of the figure which is drawn by the graph-generating unit 109 and outputs the display information to the display device 20 (Step S110). Accordingly, the display device 20 displays a graph in which the partition lines G2 indicating the threshold values of the current parameters, the plot G3 indicating the values of the pair of current parameters, the oval G4 indicating the allowable range of the values of the pair of current parameters after a predetermined time has elapsed, and the arrows G5 indicating change of the values of the current parameters are disposed.

Fourth Embodiment

The state analysis device 10 according to the first to third embodiments acquires the allowable range of values of a pair of current parameters after a predetermined time has elapsed on the basis of one prediction means such as histories of operations of the same type of devices as the calculated current parameters of the object device 30 or results of calculation from the simulator 111 that simulates the operation of the object device 30. On the other hand, a state analysis device 10 according to a fourth embodiment acquires an allowable range of values of a pair of current parameters after a predetermined time has elapsed on the basis of a plurality of prediction means.

Figure 11:
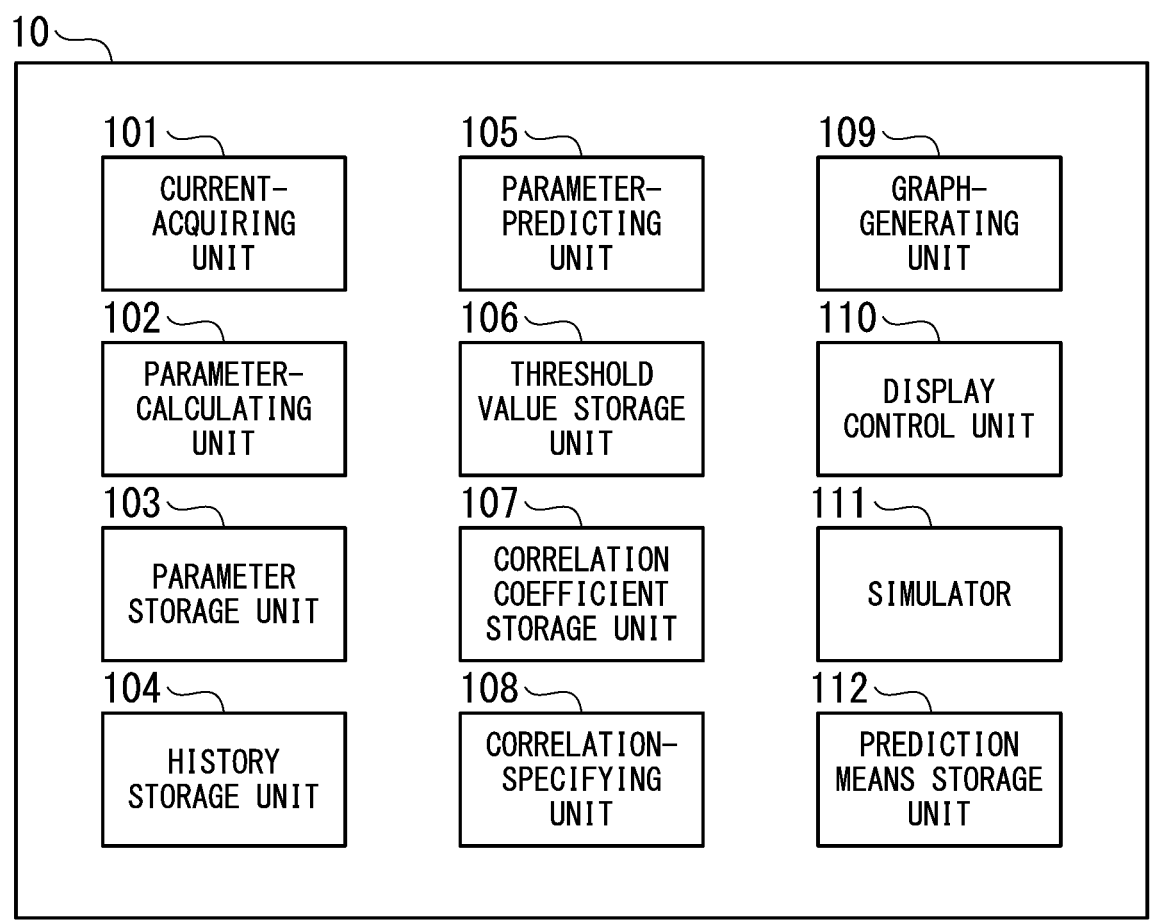
FIG. 11 is a block diagram schematically illustrating a configuration of a state analysis device according to a fourth embodiment.

FIG. 11 is a block diagram schematically illustrating a configuration of a state analysis device according to a fourth embodiment.

The state analysis device 10 according to the fourth embodiment further includes a simulator 111 and a prediction means storage unit 112 in addition to the configuration according to the first embodiment. The history storage unit 104 and the simulator 111 are an example of a prediction means.

The prediction means storage unit 112 stores a prediction means which is used to predict the allowable range of the current parameters after a predetermined time has elapsed in correlation with a range of values of a plurality of current parameters at a certain timing. The relationship between the allowable range of values of the current parameters after a predetermined time has elapsed and the prediction means is set, for example, on the basis of knowledge of skilled technicians, application conditions of the simulator 111, and an amount of histories stored in the history storage unit 104.

The parameter-predicting unit 105 predicts an allowable range of values of a pair of current parameters after a predetermined time has elapsed using information stored in the history storage unit 104 and the simulator 111. Then, the graph-generating unit 109 generates a graph by disposing the oval G4 on the basis of the prediction means stored in the prediction means storage unit 112 in correlation with the range of values of a pair of current parameters stored latest in the parameter storage unit 103.

In another embodiment, the prediction means storage unit 112 may store an application probability of each prediction means in correlation with the range of values of a plurality of current parameters at a certain timing. In this case, the graph-generating unit 109 can dispose the ovals G4 on the basis of the prediction means stored in the prediction means storage unit 112 and display the application probability to each overall G4.

While embodiments have been described above in detail with reference to the accompanying drawings, a specific configuration is not limited to the above description and various modifications in design or the like can be applied thereto.

For example, the state analysis device 10 according to the above-mentioned embodiment displays a graph associated with a pair of current parameters on the display device 20, but the invention is not limited thereto. For example, the state analysis device 10 according to another embodiment may display a high-dimensional graph associated with a group of three or more current parameters on the display device 20.

The state analysis device 10 according to the above-mentioned embodiments generates display information in which the partition lines G2 indicating the threshold values are disposed in the coordinate space with a plurality of parameters having a correlation as axes, but the invention is not limited thereto. For example, the state analysis device 10 according to another embodiment may generate display information not including the partition lines G2.

The state analysis device 10 according to the above-mentioned embodiments may generate display information including a plurality of ovals G4 every time (for example, at timing T1 and timing T2) as illustrated in FIG. 8. Here, when the current time reaches timing T1 with the elapse of time, the state analysis device 10 may generate the oval G4 using the allowable range of values of a pair of current parameters which have been calculated previously at timing T2 without recalculation, or may generate the ovals G4 again by recalculating the allowable range of values of a pair of current parameters at timing T2.

The state analysis device 10 according to the above-mentioned embodiments classifies the state of the object device 30 into three classifications including the normal state, the abnormal state, and the caution state, but the invention is not limited thereto. For example, the state analysis device 10 according to another embodiment may classify the state into two classifications including a normal state and an abnormal state or may classify the state into four or more classifications.

The state analysis device 10 according to the above-mentioned embodiments expresses an allowable range of a pair of current parameters using an oval G4, but the invention is not limited thereto. For example, the state analysis device 10 may express an allowable range of a pair of current parameters using another figure (for example, a rectangle, a circle, or a polygon). The state analysis device 10 according to the above-mentioned embodiments determines the shape of the oval G4 on the basis of correlation strength between current parameters, but the invention is not limited thereto. For example, the state analysis device 10 according to another embodiment may dispose figures with the same shape regardless of the correlation strength between current parameters.

The state analysis device 10 according to the above-mentioned embodiments generates display information using values of current parameters as state quantities of the object device 30, but the invention is not limited thereto. For example, the state analysis device 10 according to another embodiment may generate display information using other state quantities (for example, a current value, a voltage value, a temperature, a pressure, and a flow rate).

The state analysis device 10 according to the above-mentioned embodiments performs display control by outputting display information to the display device 20 which is directly connected thereto, but the invention is not limited thereto. For example, the state analysis device 10 according to another embodiment may not perform display control but may store display information in a storage medium or transmit display information to another display device 20 which is connected thereto via a network.

The state analysis device 10 according to the above-mentioned embodiments predicts a range from a minimum value to a maximum value of a plurality of specified values of current parameters as an allowable range of values of the current parameters, but the invention is not limited thereto. For example, the state analysis device 10 according to another embodiment may predict an allowable range of values of current parameters on the basis of a plurality of appearance probabilities which is specified for the current parameters. Specifically, the state analysis device 10 may calculate a standard deviation $\iota\gamma$ of values of current parameters and predict a range of $\pm 2\delta$ of a mean value of the current parameters as the allowable range of the values of the current parameters.

The state analysis device 10 according to the above-mentioned first embodiment generates display information using the values of the parameters predicted by the parameter-predicting unit 105, but the invention is not limited thereto. For example, the state analysis device 10 according to another embodiment may generate display information on the basis of predicted values obtained by adding predicted changes of the values of the current parameters to the values of the current parameters at a certain timing similarly to the second embodiment.

The object device 30 according to the above-mentioned embodiments is a rotary machine system in which a motor and an auxiliary machine rotate coaxially, but the invention is not limited thereto. For example, in an object device 30 according to another embodiment, a motor and an auxiliary machine may be connected to each other via a machine system such as a gear device.

Figure 12:
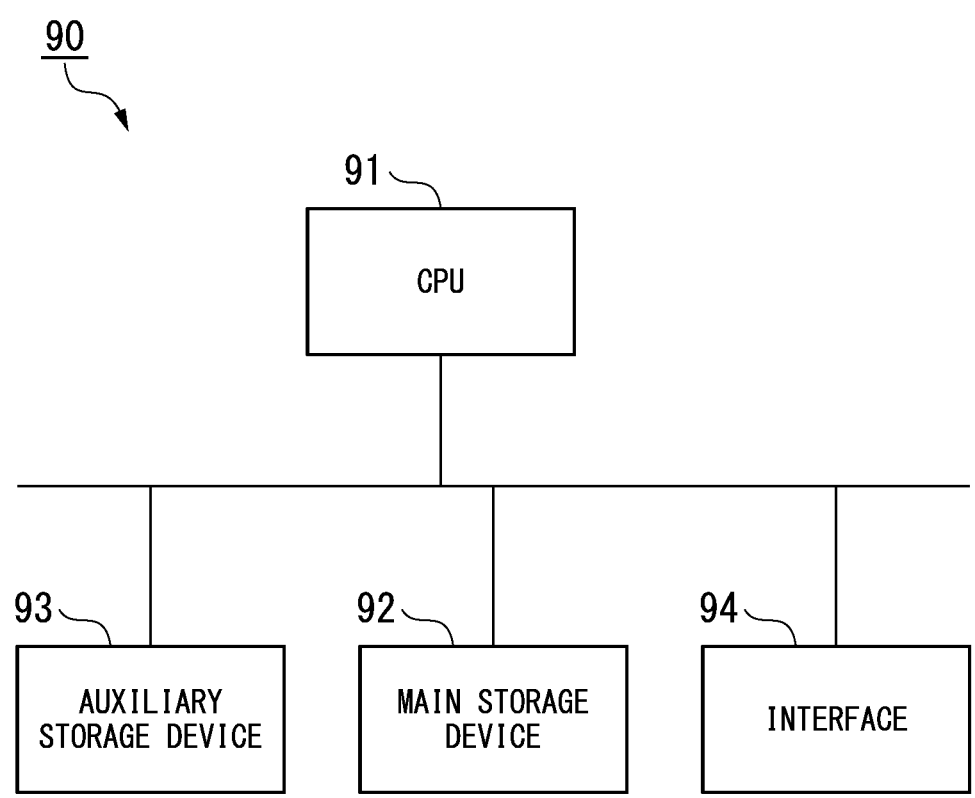
FIG. 12 is a block diagram schematically illustrating a configuration of a computer according to at least one embodiment.

FIG. 12 is a block diagram schematically illustrating a configuration of a computer according to at least one embodiment.

A computer 90 includes a CPU 91, a main storage device 92, an auxiliary storage device 93, and an interface 94.

The state analysis device 10 is mounted in the computer 90. The operations of the above-mentioned processing units are stored in the form of a program in the auxiliary storage device 93. The CPU 91 reads a program from the auxiliary storage device 93, loads the program into the main storage device 92, and performs the processes in accordance with the program. The CPU 91 secures memory areas corresponding to the above-mentioned storage units in the main storage device 92 in accordance with the program.

Examples of the auxiliary storage device 93 include a hard disk drive (HDD), a solid-state drive (SSD), a magnetic disk, a magneto-optical disc, a compact disc read-only memory (CD-ROM), a digital versatile disc read-only memory (DVD-ROM), and a semiconductor memory. The auxiliary storage device 93 may be an internal medium which is directly connected to a bus in the computer 90 or may be an external medium which is connected to the computer 90 via the interface 94 or a communicate line. When the program is transmitted to the computer 90 via the communication line, the computer 90 having received the program may load the program into the main storage device 92 and perform the processes. In at least one embodiment, the auxiliary storage device 93 is a non-transitory tangible storage medium.

The program may be provided to embody all or some of the above-mentioned functions. The program may be a program that embodies the above-mentioned functions in combination with another program which is stored in advance in the auxiliary storage device 93, that is, a so-called differential file (a differential program).

INDUSTRIAL APPLICABILITY

The state analysis device generates display information in which a predicted-value figure which is a figure with a shape corresponding to an allowable range of values of a plurality of state quantities is disposed. Accordingly, a manager of an object device can intuitively recognize the predicted values and ambiguity of prediction by visually recognizing the predicted-value figure.

REFERENCE SIGNS LIST

1 State analysis system
10 State analysis device
20 Display device
30 Object device
101 Current-acquiring unit
102 Parameter-calculating unit
103 Parameter storage unit
104 History storage unit (state quantity storage unit)
105 Parameter-predicting unit
106 Threshold value storage unit
107 Correlation coefficient storage unit
108 Correlation-specifying unit
109 Graph-generating unit
110 Display control unit
111 Simulator

The invention claimed is:

1. A state analysis device, comprising:
a state quantity-acquiring unit configured to acquire values of a plurality of state quantities at a certain timing associated with an object device;
a state quantity-predicting unit configured to predict allowable ranges of the values of the plurality of state quantities after a predetermined time has elapsed on the basis of the acquired values of the plurality of state quantities; and
a display information-generating unit configured to generate information in which a predicted-value figure which is a figure with a shape corresponding to the allowable ranges of the values of the plurality of state quantities is disposed in a coordinate space with the plurality of state quantities as axes.

2. The state analysis device according to claim 1, wherein the display information-generating unit is configured to generate the information in which an acquired-value figure which is a figure representing the values of the plurality of state quantities acquired by the state quantity-acquiring unit is additionally disposed in the coordinate space.

3. The state analysis device according to claim 1, further comprising a correlation-specifying unit configured to specify a correlation strength between the plurality of state quantities,
wherein the display information-generating unit is configured to generate the information in which a predicted-value figure with a shape corresponding to the correlation strength is disposed.

4. The state analysis device according to claim 1, further comprising a state quantity storage unit configured to store histories of the values of the plurality of state quantities of the same type of device as the object device,
wherein the state quantity-predicting unit is configured to specify a plurality of parts which are similar to change of the acquired values of the plurality of state quantities out of the histories stored in the state quantity storage unit and to predict the allowable range on the basis of the plurality of parts.

5. The state analysis device according to claim 4, wherein the state quantity-predicting unit is configured to specify a plurality of timings at which there are values similar to the acquired values of the plurality of state quantities out of the histories stored in the state quantity storage unit and to predict the allowable range on the basis of the values of the plurality of state quantities stored in the state quantity storage unit after the predetermined time elapses from the plurality of timings.

6. The state analysis device according to claim 4, wherein the state quantity-predicting unit is configured to specify a plurality of timings at which there are changes similar to changes of the acquired values of the plurality of state quantities out of the histories stored in the state quantity storage unit and to predict the allowable range on the basis of the changes of the plurality of state quantities stored in the state quantity storage unit after the predetermined time elapses from the plurality of timings.

7. The state analysis device according to claim 1, further comprising a simulator that simulates an operation of the object device,
wherein the state quantity-predicting unit is configured to predict the allowable range on the basis of the values of the plurality of state quantities which are acquired by changing an external parameter of the simulator.

8. The state analysis device according to claim 1, wherein the display information-generating unit is configured to generate the information in which the predicted-value figure with a shape including values in which an occurrence probability is equal to or greater than a predetermined value in the allowable range is disposed.

9. The state analysis device according to claim 1, wherein the state quantity-predicting unit is configured to predict the allowable range for each of a plurality of prediction means.

10. The state analysis device according to claim 9, wherein the state quantity-predicting unit is configured to determine a prediction means which is used to predict the allowable range out of the plurality of prediction means on the basis of the acquired values of the plurality of state quantities and to predict the allowable range on the basis of the determined prediction means.

11. The state analysis device according to claim 9, wherein the display information-generating unit is configured to generate the predicted-value figure for each of the plurality of prediction means and to generate the information in which the predicted-value figures are disposed.

12. A state analysis method, comprising:
a step of acquiring values of a plurality of state quantities at a certain timing associated with an object device;
a step of predicting allowable ranges of the values of the plurality of state quantities after a predetermined time has elapsed on the basis of the acquired values of the plurality of state quantities; and
a step of generating information, using a display information-generating unit, in which a predicted-value figure which is a figure with a shape corresponding to the allowable ranges of the values of the plurality of state quantities is disposed in a coordinate space with the plurality of state quantities as axes.

13. A non-transitory computer readable medium having a program stored thereon for causing a computer to perform a state analysis method, the method comprising:
a step of acquiring values of a plurality of state quantities at a certain timing associated with an object device;
a step of predicting allowable ranges of the values of the plurality of state quantities after a predetermined time has elapsed on the basis of the acquired values of the plurality of state quantities; and
a step of generating information, using a display information-generating unit, in which a predicted-value figure which is a figure with a shape corresponding to the allowable ranges of the values of the plurality of state quantities is disposed in a coordinate space with the plurality of state quantities as axes.

\* \* \* \* \*